(12) United States Patent  
Shea

(10) Patent No.: US 9,013,189 B2  
(45) Date of Patent: Apr. 21, 2015

(54) ELECTRICAL JOINT MONITORING DEVICE AND ELECTRICAL JOINT MONITORING SYSTEM EMPLOYING THE SAME

(71) Applicant: Eaton Corporation, Cleveland, OH (US)

(72) Inventor: John J. Shea, Pittsburgh, PA (US)

(73) Assignee: Eaton Corporation, Cleveland, OH (US)

( * ) Notice: Subject to any disclaimer, the term of this patent is extended or adjusted under 35 U.S.C. 154(b) by 238 days.

(21) Appl. No.: 13/671,015

(22) Filed: Nov. 7, 2012

(65) Prior Publication Data

US 2014/0125319 A1 May 8, 2014

(51) Int. Cl.
*G01R 31/04* (2006.01)
*G01R 1/20* (2006.01)
*G01R 31/02* (2006.01)
*G01R 1/067* (2006.01)

(52) U.S. Cl.
CPC .............. *G01R 1/20* (2013.01); *G01R 1/06788* (2013.01); *G01R 31/026* (2013.01); *G01R 31/043* (2013.01)

(58) Field of Classification Search
CPC ............................ G01R 31/026; G01R 15/146
USPC ............. 324/126, 103 R, 113, 114, 149, 538, 324/691, 713, 522
See application file for complete search history.

(56) References Cited

U.S. PATENT DOCUMENTS

| | | | | |
|---|---|---|---|---|
| 6,034,521 | A * | 3/2000 | Eckardt | 324/96 |
| 6,047,469 | A * | 4/2000 | Luna | 29/830 |
| 6,351,115 | B1 * | 2/2002 | Kasunich | 324/126 |
| 2007/0166831 | A1 * | 7/2007 | Watkins et al. | 436/149 |
| 2009/0212938 | A1 | 8/2009 | Swaim et al. | |
| 2010/0010758 | A1 | 1/2010 | Kinahan | |
| 2010/0062329 | A1 * | 3/2010 | Muis | 429/158 |
| 2011/0282593 | A1 * | 11/2011 | Nickel et al. | 702/39 |
| 2012/0013471 | A1 | 1/2012 | Jones | |

(Continued)

FOREIGN PATENT DOCUMENTS

| | | |
|---|---|---|
| DE | 101 38 261 A1 | 2/2003 |
| EP | 2 211 189 A2 | 7/2010 |

(Continued)

OTHER PUBLICATIONS

European Patent Office, "International Search Report and Written Opinion", Dec. 2, 2013, 12 pp.

*Primary Examiner* — Huy Q Phan  
*Assistant Examiner* — Dustin Dickinson  
(74) *Attorney, Agent, or Firm* — Eckert Seamans Cherin & Mellott, LLC; Nathaniel C. Wilks

(57) ABSTRACT

An electrical joint monitoring device including a mounting assembly and a wireless transponder unit. The mounting assembly includes a first conductive contact structured to electrically connect to a first conductive member of an electrical joint and a second conductive contact structured to electrically connect to a second conductive member of the electrical joint. The wireless transponder unit includes a control unit electrically connected to the first and second conductive contacts and an antenna electrically connected to the control unit. The wireless transponder unit is configured to sense a voltage difference between the first and second conductive contacts, to generate information based on the voltage difference, and to output the information to a wireless reader unit via the antenna.

18 Claims, 3 Drawing Sheets

(56) References Cited

U.S. PATENT DOCUMENTS

2012/0105086 A1* 5/2012 Bommer et al. .............. 324/713
2013/0335061 A1* 12/2013 de Buda et al. .............. 324/127

FOREIGN PATENT DOCUMENTS

| EP | 2 385 382 A1 | 11/2011 |
| GB | 2 465 590 A | 5/2010 |

* cited by examiner

ELECTRICAL JOINT MONITORING DEVICE AND ELECTRICAL JOINT MONITORING SYSTEM EMPLOYING THE SAME

BACKGROUND

1. Field

The disclosed concept pertains generally to electrical joints and, more particularly, to electrical joint monitoring.

2. Background Information

Some typical types of electrical joints are formed by securing two conductive members together with, for example, a fastener. The electrical performance of the joint, and in particular, the conductivity of the joint, depends partially on the conductive members being secured together tightly. A loosening of the electrical joint reduces the conductivity of the electrical joint and can cause additional problems such as overheating.

Due to the aforementioned problems, it is desirable to determine whether the conductive members in an electrical joint are properly secured together. However, verifying whether the conductive members in an electrical joint are properly secured together can consume a technician's time. In particular, when an electrical system includes numerous electrical joints, or if it is difficult to reach electrical joints, a large amount of technician's time can be taken verifying whether conductive members in electrical joints are properly secured together.

There is room for improvement in the area of monitoring electrical joints.

SUMMARY

These needs and others are met by embodiments of the disclosed concept, which provide an electrical joint monitoring device including a number of mounting assemblies and a wireless transponder unit.

These needs and others are also net by embodiments of the disclosed concept, which provide an electrical joint monitoring system including an electrical joint monitoring device and a wireless reader unit.

In accordance with embodiments of the disclosed concept, an electrical joint monitoring device for an electrical joint including a first conductive member and a second conductive member comprises: a mounting assembly including a first conductive contact structured to electrically contact the first conductive member of the electrical joint and a second conductive contact structured to electrically contact the second conductive member of the electrical joint and a wireless transponder unit including a control unit electrically connected to the first and second conductive contacts and an antenna electrically connected to the control unit, the wireless transponder unit being configured to sense a voltage difference between the first and second conductive contacts, to generate information based on the voltage difference, and to output the information to a wireless reader unit via the antenna.

In accordance with other embodiments of the disclosed concept, an electrical joint monitoring device for a number of electrical joints comprises: as number of mounting assemblies, each of the number of mounting assemblies including a first conductive contact structured to electrically contact a first conductive member of one of the number of electrical joints and a second conductive contact structured to electrically contact a second conductive member of the one of the number of electrical joints; and a wireless transponder unit including as control unit electrically connected to the first and second conductive contacts of each of the number of mounting assemblies and an antenna electrically connected to the control unit, the wireless transponder unit being configured to sense a plurality of voltage differences between the first and second conductive contacts of each of the number of mounting assemblies, to generate information based on the voltage differences, and to output the information to a wireless reader unit via the antenna.

In accordance with other embodiments of the disclosed concept, an electrical joint monitoring system comprises: a number of electrical joints, each of the number of electrical joints including a first conductive member and a second conductive member; a number of mounting assemblies, each of the number of mounting assemblies corresponding to one of the number of electrical joints and including a first conductive contact structured to electrically connect to the first conductive member of the corresponding one of the number of electrical joints and a second conductive contact structured to electrically connect to the second conductive member of the corresponding one of the number of electrical joints; and a wireless transponder unit including a control unit electrically connected to the first and second conductive contacts of each of the number of mounting assemblies and an antenna electrically connected to the control unit, the wireless transponder unit being configured to sense a plurality of voltage differences between the first and second conductive contacts of each of the number of assemblies, to generate information based on the voltage differences, and to output the information via the antenna; and a wireless reader unit structured to receive the information.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
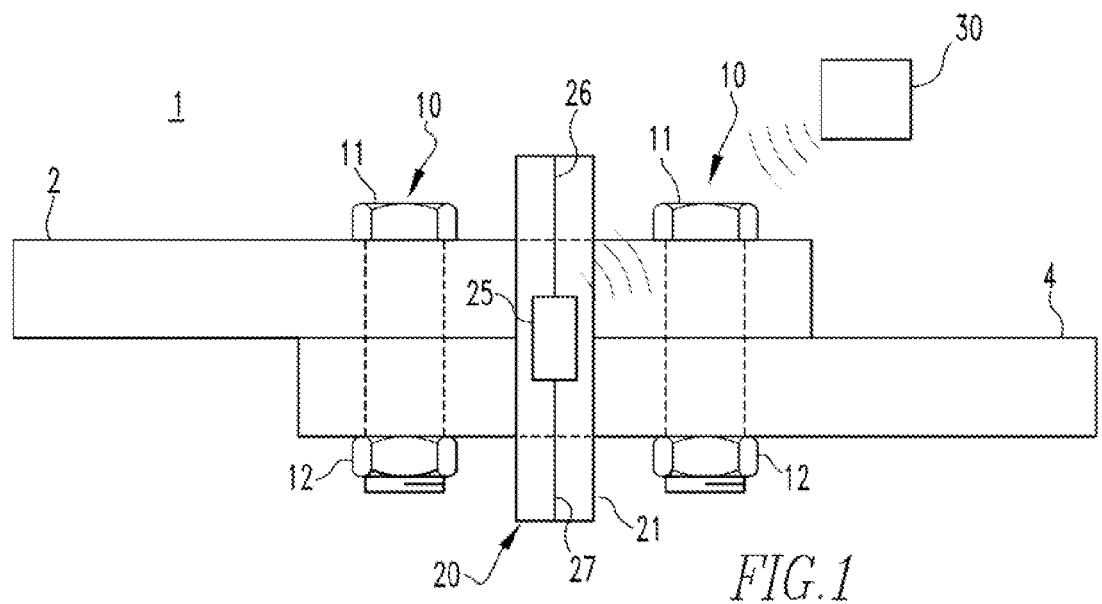
FIGS. 1 and 2 are elevation views of an electrical joint monitoring system in accordance with an example embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the term "fastener" refers to any suitable connecting or tightening mechanism expressly including, but not limited to, screws, bolts and the combinations of bolts and nuts (e.g., without limitation, lock nuts) and bolts, washers and nuts.

As employed herein, the statement that two or more parts are "coupled" together shall mean that the parts are joined together either directly or joined through one or more intermediate parts.

As employed herein, the term "number" shall mean one or an integer greater than one (i.e., a plurality).

Figure 2:
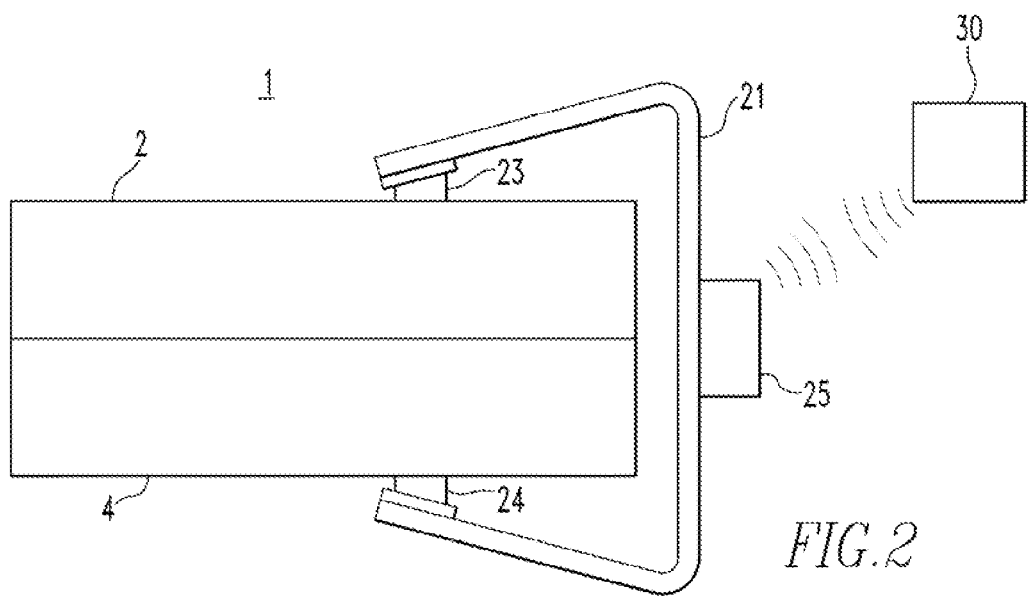

Referring to FIGS. 1 and 2, an electrical joint monitoring system 1 is shown. The electrical joint is formed by securing first and second conductive members 2,4 together with one or more fasteners 10. The first and second conductive members 2,4 can be, for example and without limitation bus bars. The electrical joint monitoring system 1 includes an electrical joint monitoring device 20 and a wireless reader unit 30. The electrical joint monitoring device 20 includes a mounting assembly 21 that includes first and second conductive contacts 23,24 structured to electrically connect to the first and second conductive members 2,4, respectively. The electrical joint monitoring device 20 also includes a wireless transponder unit 25 that is configured to wirelessly communicate with the wireless reader unit 30.

The example fasteners 10 each include a bolt 11 and a nut 12. However, it is contemplated that any suitable fastener may be used to secure the first and second conductive members 2,4 together.

The mounting assembly 21 is structured to couple with the electrical joint in the example embodiment shown in FIGS. 1 and 2, the mounting assembly 21 is a spring clip that attaches onto the first and second conductive members 2,4. The mounting assembly 21 may also be an elastic clip that biases the first and second conductive contacts 23,24 against the first and second conductive members 2,4 when the mounting assembly 21 is coupled with the electrical joint. It is also contemplated that the mounting assembly 21 may be structured to couple with the electrical joint in any suitable manner. For example and without limitation, the mounting assembly 21 may be structured as a clamp, a vice, a bolt, a spring loaded pin, or any other suitable structure for coupling with the electrical joint.

The first and second conductive contacts 23,24 are disposed on the mounting assembly 21 such that when the mounting assembly 21 is coupled to the electrical joint the first conductive contact 23 electrically contacts the first conductive member 2 and the second conductive contact 24 electrically contacts the second conductive member 4. In the example embodiment shown in FIGS. 1 and 2, the first and second conductive contacts 23,24 are shaped to make flush electrical contact with the first and second conductive members 2,4. It is contemplated that in other non-limiting embodiments, the first and second conductive contacts 23,24 can have other shapes such as, for example and without limitation, spherical shapes or other shapes suitable for electrically contacting the first and second conductive members 2,4.

The mounting assembly 21 electrically insulates the first and second conductive contacts 23,24 from each other. The mounting assembly 21 further includes first and second conductors 2627. The first and second conductors 26,27 electrically connect the first and second conductive contacts 23,24 to the wireless transponder unit 25, respectively.

The wireless transponder unit 25 senses a voltage difference between the first and second conductive contacts 23,24. The wireless transponder unit 25 then generates information based on the sensed voltage difference and outputs the information.

The wireless reader unit 30 communicates with the wireless transponder unit 25 and is configured to receive the output of the wireless transponder unit 25. In one non-limiting example embodiment, the wireless transponder unit 25 is a passive transponder that responds to interrogation by the wireless reader unit 30. In another non-limiting example embodiment, the wireless transponder unit 25 includes a power source or receives power from a power source other than the wireless reader unit 30, and can provide an output without being interrogated by the wireless reader unit 30. The wireless transponder unit 25 may be, for example and without limitation, a radio frequency identification (RFID) tag and the wireless reader unit 30 may be, for example and without limitation, an RFID reader.

Figure 3:
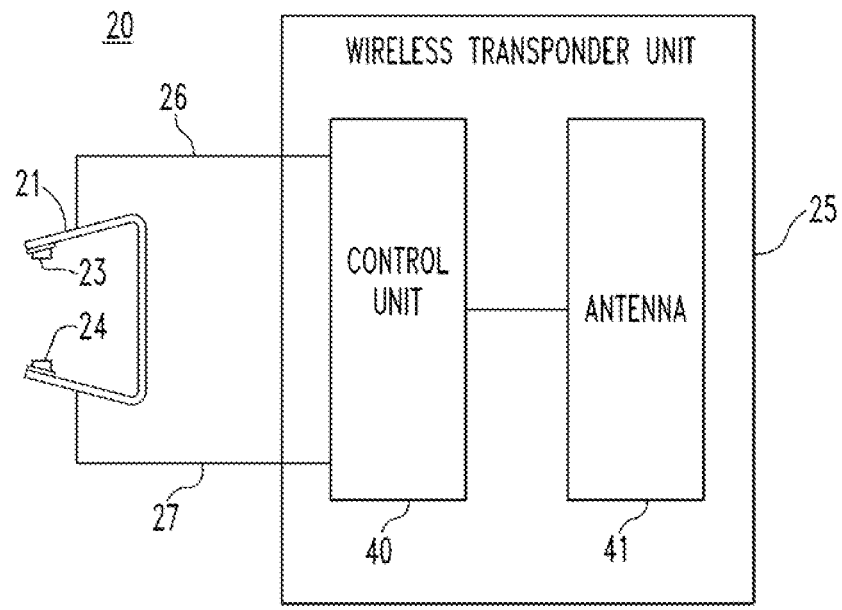
FIGS. 3 and 4 are diagrams of electrical joint monitoring devices in accordance with some embodiments of the disclosed concept.

Referring to FIG. 3, the wireless transponder unit 25 includes a control unit 40 and an antenna 41. The first and second conductive contacts 23,24 are electrically connected to the control unit 40 by the first and second conductors 26,27, respectively. The control unit 40 generates the information based on the sensed voltage difference and outputs the information via the antenna 41.

The information generated by the control unit 40 may be information representing the voltage difference between the first and second conductive contacts 23,24. In another non-limiting example embodiment, the control unit 40 calculates a risk level of the electrical joint from the sensed voltage difference and generates information representing the calculated risk level of the electrical joint. In another non-limiting example embodiment, the control unit 40 determines a quality of the electrical joint based on the sensed voltage difference and generates information representing the calculated quality of the electrical joint. In another non-limiting example embodiment, the control unit 40 determines a conductivity of the electrical joint based on the sensed voltage difference and generates information representing the calculated conductivity of the electrical joint. In yet another non-limiting example embodiment, the control unit 40 determines a conductivity of the electrical joint based on the sensed voltage difference and generates information representing the calculated conductivity of the electrical joint over a period or time. It is also contemplated that the above-described calculations can also be performed by the wireless reader unit 30 without departing; from the scope of the disclosed concept.

TABLE 1

Example Decision Table for Joint Quality and Risk of Overheating

| Sensed Voltage Difference $V_{diff}$ (mV$_{rms}$) | Current (A$_{rms}$) | Joint Quality | Risk of Overheating |
|---|---|---|---|
| $V_{diff} < 1.5$ | 500 | Excellent | Very Low |
| $1.5 < V_{diff} < 2.5$ | 500 | Good | Low |
| $2.5 < V_{diff} < 5$ | 500 | Sub Par | Medium |
| $5 < V_{diff} < 7.5$ | 500 | Poor | High |
| $V_{diff} > 7.5$ | 500 | Very Poor | Very High |
| $V_{diff} < 3.0$ | 1000 | Excellent | Very Low |
| $3.0 < V_{diff} < 5.0$ | 1000 | Good | Low |
| $5.0 < V_{diff} < 10.0$ | 1000 | Sub Par | Medium |
| $10.0 < V_{diff} < 15.0$ | 1000 | Poor | High |
| $V_{diff} > 15.0$ | 1000 | Very Poor | Very High |

Table 1 shows an example decision table which can be employed by the control unit 40 or wireless reader unit 30 to determine the quality or risk of overheating of the electrical joint based on the sensed voltage difference. In the example shown in Table 1, the voltage difference was measured across the electrical joint for 0.5 minutes while the joint was electrically connected to a 60 Hz alternating current (AC) power source. As shown in Table 1, the current through the electrical joint can be considered in the determination of the joint quality and the risk of overheating. If the current through the electrical joint is taken into account in the determination of the joint quality of the risk of overheating, the current through the electrical joint can be sensed by any suitable means.

In addition to generating the information based on the sensed voltage difference, the control unit 40 can also generate identification information. For example and without limitation, the identification information can include information for identifying the electrical joint or mounting assembly 21 corresponding to the information based on the sensed voltage difference. The identification information can also include information for identifying the wireless transponder unit 25.

In some non-limiting example embodiments, the wireless transponder unit 25 is disposed on the mounting assembly 21 (FIGS. 1 and 2). When the wireless transponder unit 25 is disposed on the mounting assembly 21, it can be disposed at any suitable location on the mounting assembly 21. In other non-limiting example embodiments, the wireless transponder unit 25 is separated from the mounting assembly 21.

Figure 4:
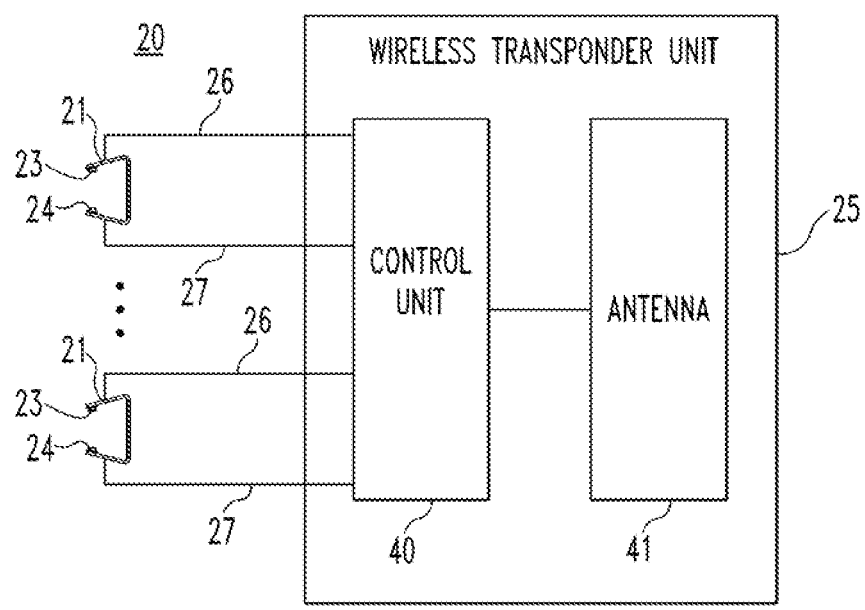

It is contemplated that any number of mounting assemblies 21 can correspond to one Wireless transponder unit 2 without departing from the scope of the disclosed concept. For example and without limitation, one mounting assembly 21 can correspond to one wireless transponder unit 25, as shown in FIG. 3, or a plurality of mounting assemblies 21 can correspond to one wireless transponder device 25, as shown in FIG. 4.

Figure 5:
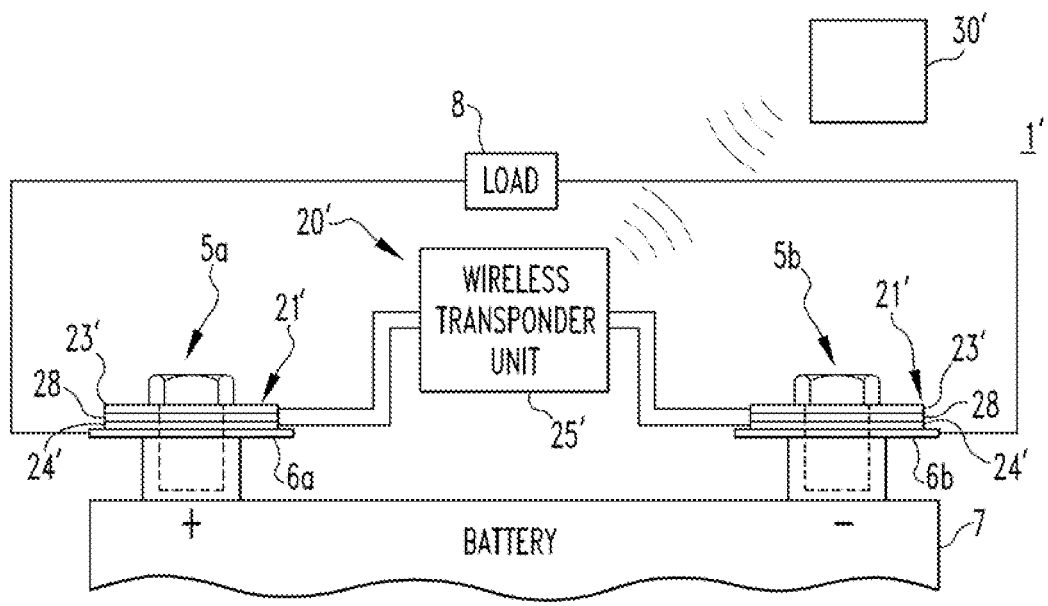
FIG. 5 is a diagram of an electrical joint monitoring system in accordance with another example embodiment of the disclosed concept.

Referring to FIG. 5, another non-limiting example embodiment of an electrical joint monitoring system 1' is shown. In the example embodiment of FIG. 5, electrical joints are formed by battery terminals 5a,5b and battery terminal connectors 6a,6b. The battery 7 provides power to a load 8 through the battery terminal connectors 6a,6b. The electrical joint monitoring system 1' includes an electrical joint monitoring device 20' and a wireless reader unit 30'. The electrical joint monitoring device 20' includes mounting assemblies 21' corresponding to each of the battery terminals 5a,5b. The mounting assemblies 21' are electrically connected to the load 8 and are each electrically connected to a wireless transponder unit 25'. The wireless transponder unit 25' is configured to communicate with the wireless reader unit 30'.

Each mounting assembly 21' has the form of a washer assembly and is disposed between a portion of one of the battery terminals 5a,5b and one of the battery terminal connectors 6a,6b. Each mounting assembly 21 includes a first conductive washer 23' structured to electrically contact one of the battery terminals 5a,5b and a second conductive washer 24' structured to electrically contact one of the battery terminal connectors 6a,6b. Each mounting assembly 21' further includes an insulating washer 28 disposed between the first and second conductive washers 23',24'.

The first and second conductive washers 23',24' are each electrically connected with the wireless transponder unit 25'. The wireless transponder unit 25' senses a voltage difference between the first and second conductive washers 23',24'. The wireless transponder unit 25' generates and outputs information based on the sensed voltage difference to the wireless reader unit 30'.

In the example embodiment shown in FIG. 5, the mounting assemblies 21' are mounted to the positive and negative terminals 5a,5b of the battery 7. In one non-limiting example embodiment, the wireless transponder unit 25' receives and uses power from the battery 7 to output the information based on the sensed voltage difference. By using the power of the battery 7, the wireless transponder unit 25' is able to output information a greater distance.

In one non-limiting example embodiment, the battery 7 is a uninterruptible power supply (UPS) battery. However, it is contemplated that the electrical joint monitoring device 20' can be used with other types of batteries without departing from the scope of the disclosed concept. Additionally, it is contemplated that the electrical joint, monitoring device 20' can be used in conjunction with other types of power source terminals and terminal connectors without departing from the scope of the disclosed concept.

Figure 6:
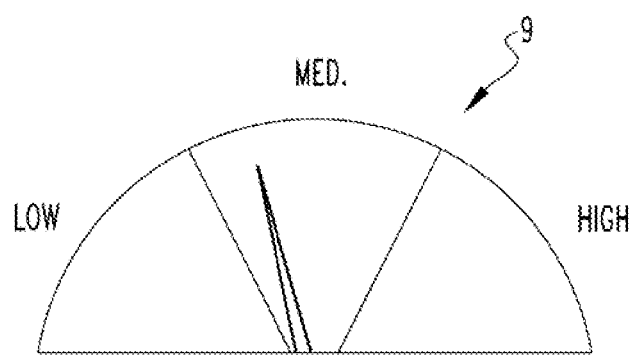
FIG. 6 is an example display in accordance with some embodiments of the disclosed concept.

Referring to FIG. 6 an example of a meter 9 which can be displayed by the wireless reader unit 30,30' is shown. The wireless reader unit 30,30' can, for example and without limitation, indicate the risk level, quality level, conductivity level, or other information regarding an electrical joint being monitored on the displayed meter 9. However, it is contemplated that any suitable manner of displaying or outputting information can be employed by the wireless reader unit 30,30' without departing from the scope of the disclosed concept.

While specific embodiments of the disclosed concept have been described in detail, it will be appreciated by those skilled in the an that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An electrical joint monitoring device for an electrical joint including a first conductive member and a second conductive member, said device comprising:
   a mounting assembly including a first conductive contact structured to electrically contact the first conductive member of said electrical joint and a second conductive contact structured to electrically contact the second conductive member of said electrical joint; and
   a wireless transponder unit including a control unit electrically connected to said first and second conductive contacts and an antenna electrically connected to said control unit, the wireless transponder unit being configured to sense a voltage difference between said first and second conductive contacts, to generate information based on said voltage difference, and to output said information to a wireless reader unit via said antenna,
   wherein the first conductive member includes a first surface and a second surface opposite the first surface, wherein the second conductive member includes a first surface and a second surface opposite the first surface, wherein the first surface of the first conductive member is structured to abut against and form an electrical connection with the first surface of the second conductive member, and wherein the first conductive contact is structured to contact the second surface of the first conductive member and the second conductive contact is structured to contact the second surface of the second conductive member.

2. The electrical joint monitoring device of claim 1, wherein said mounting assembly is structured as a clip member; and wherein said first and second conductive contacts are disposed on said clip member.

3. The electrical joint monitoring device of claim 2, wherein said mounting assembly is structured as an elastic clip member configured to bias said first and second contacts against said first and second conductive members, respectively.

4. The electrical joint monitoring device of claim 1, wherein said mounting assembly is structured as one of a clamp and a vice.

5. The electrical joint monitoring device of claim 1, wherein said wireless transponder unit is disposed on said mounting assembly.

6. The electrical joint monitoring device of claim 1, wherein said first conductive member is a first bus bar and said second conductive member is a second bus bar.

7. The electrical joint monitoring device of claim 1, wherein said electrical joint is formed by a power source terminal and a terminal connector.

8. The electrical joint monitoring device of claim 1, wherein said wireless transponder unit is a radio frequency identification unit.

9. An electrical joint monitoring device for a number of electrical joints, said device comprising:
  a number of mounting assemblies, each of said number of mounting assemblies including a first conductive contact structured to electrically contact a first conductive member of one of said number of electrical joints and a second conductive contact structured to electrically contact a second conductive member of said one of said number of electrical joints; and
  a wireless transponder unit including a control unit electrically connected to said first and second conductive contacts of each of the number of mounting assemblies and an antenna electrically connected to said control unit, the wireless transponder unit being configured to sense a plurality of voltage differences between the first and second conductive contacts of each of the number of mounting assemblies, to generate information based on said voltage differences, and to output said information to a wireless reader unit via said antenna,
  wherein the first conductive member of one of said number of electrical joints includes a first surface and a second surface opposite the first surface, wherein the second conductive member of one of said electrical joints includes a first surface and a second surface opposite the first surface, wherein the first surface of the first conductive member of one of said electrical joints is structured to abut against and form an electrical connection with the first surface of the second conductive member of one of said electrical joints, and wherein the first conductive contact is structured to contact the second surface of the first conductive member of one of said electrical joints and the second conductive contact is structured to contact the second surface of the second conductive member of one of said electrical joints.

10. The electrical joint monitoring device of claim 9, wherein at least one of the number of mounting assemblies is structured as a clip member; and wherein said first and second conductive contacts are disposed on said clip member.

11. The electrical joint monitoring device of claim 10, wherein at least one of the number of mounting assemblies is structured as an elastic clip member configured to bias said first and second conductive contacts against said first and second conductive members, respectively, of said one of said number of electrical joints.

12. The electrical joint monitoring device of claim 9, wherein at least one of the number of mounting assemblies is structured as a clamp or a vice.

13. The electrical joint monitoring device of claim 9, wherein one of said number of electrical joints is a positive terminal of a power source and another one of said number of electrical joints is a negative terminal of said power source; and wherein said wireless transponder unit is configured to receive power from said power source and to use said power to output said information.

14. The electrical joint monitoring device of claim 13, wherein said power source is a uninterruptible power supply (UPS) battery.

15. The electrical joint monitoring device of claim 9, wherein said wireless transponder unit is a radio frequency identification unit.

16. An electrical joint monitoring system comprising:
  a number of electrical joints, each of said number of electrical joints including a first conductive member and a second conductive member;
  a number of mounting assemblies, each of said number of mounting assemblies corresponding to one of the number of electrical joints and including a first conductive contact structured to electrically connect to the first conductive member of the corresponding one of the number of electrical joints and a second conductive contact structured to electrically connect to the second conductive member of the corresponding one of the number of electrical joints; and
  a wireless transponder unit including a control unit electrically connected to said first and second conductive contacts of each of the number of mounting assemblies and an antenna electrically connected to said control unit, the wireless transponder unit being configured to sense a plurality of voltage differences between the first and second conductive contacts of each of the number of mounting assemblies, to generate information based on said voltage differences, and to output said information via said antenna; and
  a wireless reader unit structured to receive said information,
  wherein the first conductive member of one of said number of electrical joints includes a first surface and a second surface opposite the first surface, wherein the second conductive member of one of said electrical joints includes a first surface and a second surface opposite the first surface, wherein the first surface of the first conductive member of one of said electrical joints is structured to abut against and form an electrical connection with the first surface of the second conductive member of one of said electrical joints, and wherein the first conductive contact is structured to contact the second surface of the first conductive member of one of said electrical joints and the second conductive contact is structured to contact the second surface of the second conductive member of one of said electrical joints.

17. The electrical joint monitoring system of claim 16, wherein the information based on said voltage differences is one of information representing said voltage differences, information representing risk levels of each of the number of electrical joints, information representing quality levels of each of the number of electrical joints, and information representing conductivity levels of each of the number of electrical joints; and wherein the wireless reader unit outputs said information based on said voltage differences.

18. The electrical joint monitoring system of claim 16, wherein said wireless transponder unit is a radio frequency identification unit; and wherein said wireless reader unit is a radio frequency identification reader unit.

* * * * *